(12) United States Patent
Hosomi

(10) Patent No.: US 9,711,460 B2
(45) Date of Patent: Jul. 18, 2017

(54) SEMICONDUCTOR DEVICE

(71) Applicant: Mitsubishi Electric Corporation, Tokyo (JP)

(72) Inventor: Takeshi Hosomi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/132,302

(22) Filed: Apr. 19, 2016

(65) Prior Publication Data
US 2017/0053877 A1    Feb. 23, 2017

(30) Foreign Application Priority Data
Aug. 20, 2015  (JP) ................. 2015-163055

(51) Int. Cl.
| | | |
|---|---|---|
| H01L 23/02 | (2006.01) | |
| H01L 23/544 | (2006.01) | |
| H01L 23/66 | (2006.01) | |
| H01L 23/31 | (2006.01) | |

(52) U.S. Cl.
CPC ........ *H01L 23/544* (2013.01); *H01L 23/3114* (2013.01); *H01L 23/66* (2013.01); *H01L 2223/6644* (2013.01); *H01L 2223/6683* (2013.01); *H01L 2224/32245* (2013.01); *H01L 2224/48091* (2013.01); *H01L 2224/48247* (2013.01); *H01L 2224/73265* (2013.01); *H01L 2924/16195* (2013.01); *H01L 2924/181* (2013.01)

(58) Field of Classification Search
CPC ........ H05K 1/18; H05K 1/181; H01L 23/544; H01L 23/3114; H01L 23/66
USPC .......................................... 257/680
See application file for complete search history.

(56) References Cited

U.S. PATENT DOCUMENTS

| | | | | |
|---|---|---|---|---|
| 5,317,438 A | * | 5/1994 | Suzuki ............... | G02F 1/13452 349/149 |
| 2008/0202209 A1 | * | 8/2008 | Lambkin ................. | G01J 1/04 73/31.05 |
| 2013/0050228 A1 | | 2/2013 | Petersen et al. | |
| 2013/0093037 A1 | * | 4/2013 | Kirihara ................. | G01J 5/04 257/435 |
| 2015/0116954 A1 | * | 4/2015 | Jan ......................... | H05K 1/18 361/740 |

FOREIGN PATENT DOCUMENTS

| | | |
|---|---|---|
| JP | 2000-157702 A | 6/2000 |
| JP | 2000-254318 A | 9/2000 |

(Continued)

OTHER PUBLICATIONS

An Office Action issued by Taiwan Patent Office on Apr. 13, 2017, which corresponds to Taiwanese Patent Application No. 105112228 and is related to U.S. Appl. No. 15/132,302.

*Primary Examiner* — Trung Q Dang
(74) *Attorney, Agent, or Firm* — Studebaker & Brackett PC

(57) ABSTRACT

A semiconductor device includes: a semiconductor chip including an electronic part; and a package sealing the semiconductor chip, wherein the package includes a transparent section which is opaque to visible light and transparent to near-infrared light or near-ultraviolet light, and the transparent section is disposed in such a way that the electronic part is observed from outside under the near-infrared light or the near-ultraviolet light.

5 Claims, 1 Drawing Sheet

(56) References Cited

FOREIGN PATENT DOCUMENTS

| | | |
|---|---|---|
| JP | 2002-000881 A | 1/2002 |
| JP | 2002-313976 A | 10/2002 |
| TW | 201318112 A1 | 5/2013 |

* cited by examiner

SEMICONDUCTOR DEVICE

BACKGROUND OF THE INVENTION

Field

The present invention relates to a semiconductor device capable of easily recognizing an appearance of a package while making an inside of the package observable after sealing.

Background

Semiconductor devices that come with a semiconductor chip such as a transistor, diode or IC contained in a metallic, ceramic or resin package are used for various electronic apparatuses. When a foreign matter is mixed into the package of such a semiconductor device, even if no abnormality is detected in an electric characteristic inspection before shipment, the foreign matter may be deformed or part of a component thereof may cause the semiconductor chip to deteriorate while in use after shipment, thereby causing an abnormality in electric characteristics of the semiconductor device. For this reason, the interior of the package and the top surface of the semiconductor chip are observed using an optical microscope to check for the mixed foreign matter during assembly. However, the foreign matter may be mixed in after the inspection of the foreign matter inside the package until sealing, and it is not possible to detect a product with a mixed foreign matter if no abnormality is detected in electric characteristics at a point in time of an electric characteristic inspection after sealing. In contrast, a semiconductor device is proposed which uses a transparent package that facilitates visual recognition of a sealed IC (e.g., see Japanese Patent Laid-Open No. 2002-881).

A mark indicating the direction of an electrode, product name and manufacturing number or the like is printed on the package. However, when a package transparent to visible light is used, the mark printed on the package overlaps with an inner structure that sees through the package, making it difficult to read the mark. It is also difficult to detect damages on the package surface in an appearance inspection.

SUMMARY

The present invention has been implemented to solve the above-described problems and it is an object of the present invention to provide a semiconductor device capable of easily recognizing an appearance of a package while making an inside of the package observable after sealing.

According to the present invention, a semiconductor device includes: a semiconductor chip including an electronic part; and a package sealing the semiconductor chip, wherein the package includes a transparent section which is opaque to visible light and transparent to near-infrared light or near-ultraviolet light, and the transparent section is disposed in such a way that the electronic part is observed from outside under the near-infrared light or the near-ultraviolet light.

According to the present invention, since the transparent section of the package is opaque to visible light, it is possible to easily recognize the appearance of the package. Furthermore, since the transparent section is transparent to near-infrared light or near-ultraviolet light, the inside of the package thereof can be observed after sealing under near-infrared light or near-ultraviolet light.

Other and further objects, features and advantages of the invention will appear more fully from the following description.

DESCRIPTION OF EMBODIMENTS

A semiconductor device according to the embodiments of the present invention will be described with reference to the drawings. The same components will be denoted by the same symbols, and the repeated description thereof may be omitted.

First Embodiment

Figure 1:
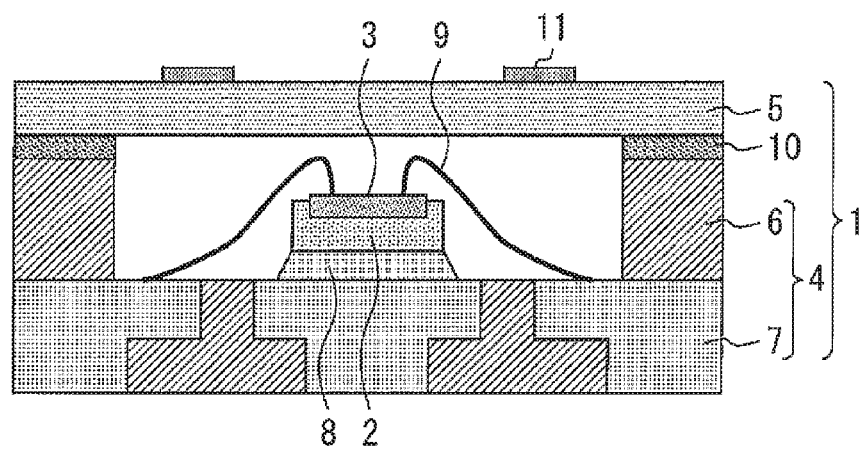
FIG. 1 is a cross-sectional view illustrating a semiconductor device according to a first embodiment of the present invention.

FIG. 1 is a cross-sectional view illustrating a semiconductor device according to a first embodiment of the present invention. This semiconductor device is neither light-receiving device nor light-emitting device, but is, for example, a microwave communication high-frequency signal amplification device, switching device, oscillator or MMIC (monolithic microwave integrated circuit). Therefore, the semiconductor device does not need any transparent package while functioning as a normal device.

A package 1 seals a semiconductor chip 2. An electronic part 3 such as a transistor, diode or electric circuit is formed on a top surface of the semiconductor chip 2. The package 1 includes a package body 4 and a cap 5.

The package body 4 includes a package main member 6 made of ceramics, resin or the like and an electric wiring 7. An underside of the semiconductor chip 2 is fixed to the package body 4 via a die bonding member 8 made of silver paste, gold tin solder, epoxy resin or the like. The electric wiring 7 is obtained by plating an alloy of copper, iron or nickel or the like with gold, silver or tin or the like, and includes a pad section inside the package and an electrode section led out of the package. The electronic part 3 of the semiconductor chip 2 and the pad section of the electric wiring 7 of the package 1 are connected together via a metal thin wire 9 made of a gold alloy or copper alloy or the like. Note that an electronic part other than the semiconductor chip 2, such as a resistor or capacitor may be accommodated in the package 1.

The cap 5 is fixed to the package body 4 via an adhesive 10 made of epoxy resin or the like and is configured so as to cover an entire main surface (top surface in FIG. 1) of the package body 4. The cap 5 is a transparent section which is opaque to visible light (wavelength 380 nm to 780 nm) and transparent to near-infrared light (wavelength 800 nm to 2500 nm) or near-ultraviolet light (wavelength 200 nm to 380 nm). For this reason, the electronic part 3 of the semiconductor chip 2 in the package 1 is observable from outside the package 1 via the cap 5. In the present embodiment, the entire cap 5 that covers the top surface of the package body 4 is configured as a transparent section, and therefore the entire top surface of the semiconductor device is formed as a transparent section. Note that it is not necessarily essential that the cap 5 should cover the entire top surface of the semiconductor device, but such a configuration may be adopted that the package body 4 has a larger outside shape and the cap 5 covers only part of the top surface of the package body 4. Furthermore, the cap 5 may cover not only the top surface of the package body 4 but also the side face or both of the top surface and the side face.

The cap 5 is manufactured by mixing and curing a visible light-absorbing material that absorbs visible light using an organic pigment, inorganic pigment or the like with a transparent base material such as transparent epoxy resin or fluorine-containing polyimide.

A sealed semiconductor device is observed by an infrared camera using a light source of near-infrared light (e.g., infrared LED having a wavelength of 890 nm) as illumination, subjected to a foreign matter inspection, and then a mark 11 indicating an electrode direction, product name or manufacturing number or the like is printed on the cap 5.

According to the present embodiment, since the cap 5 of the package 1 is opaque to visible light, it is possible to easily recognize the appearance of the package 1 such as the mark 11 or damages through a visual inspection or image recognition of visible light. Furthermore, since the cap 5 is transparent to near-infrared light or near-ultraviolet light, the inside of the package 1 thereof can be observed after sealing under near-infrared light or near-ultraviolet light. Therefore, it is possible to perform a foreign matter inspection on the inside of the semiconductor device after sealing. Furthermore, it is possible to perform not only a foreign matter inspection but also inspections for checking misalignment or fracture of the semiconductor chip 2, bending of wiring or the like.

Figure 2:
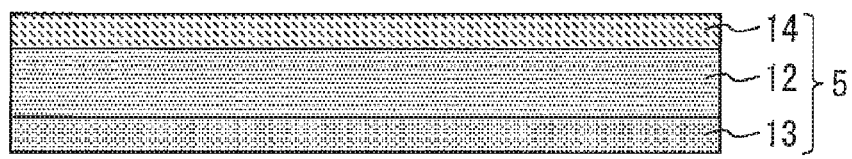
FIG. 2 is a cross-sectional view illustrating the cap according to the first embodiment of the present invention.

FIG. 2 is a cross-sectional view illustrating the cap according to the first embodiment of the present invention. The cap 5 includes a base material 12 made of transparent resin or glass, a transparent conductive film 13 placed therebelow and made of indium tin oxide, zinc oxide or the like formed through vapor deposition or sputtering and a film 14 made of a visible light-absorbing material coated on the top surface of the base material 12. Electromagnetic waves such as microwave or millimeter wave intruding into the semiconductor device from outside are shielded by the transparent conductive film 13. Therefore, it is possible to restrain extraneous electromagnetic waves from intruding into the semiconductor device, adversely affecting operation, and reduce, for example, noise of an output signal.

Furthermore, as an adhesive 10 that fixes the cap 5 to the package body 4, it is possible to use ultraviolet curing resin which is cured with ultraviolet rays to which the cap 5 exhibits transparency. In this case, the ultraviolet curing resin and the cap 5 are placed on the package body 4, then irradiated with ultraviolet rays from above the cap 5, the ultraviolet curing resin is cured and the cap 5 is fixed. Thus, the cap 5 can be fixed without heating it. Therefore, sealing can be completed at a lower temperature and in a shorter time than when thermosetting resin is used. Therefore, it is possible to use a heat-vulnerable material and also reduce energy consumption in manufacturing steps.

The ultraviolet curing resin is generally made of monomer, oligomer or photopolymerization initiator and other additives. When irradiated with light, the photopolymerization initiator generates ions, the ions are polymerized with a monomer or oligomer, and are generally cured at a lower temperature and in a shorter time than thermosetting resin. Examples of ultraviolet curing resin include acrylic resin, epoxy resin or silicone-based resin, and these types of resin are easily available in the market (manufactured by Three-Bond Holdings Co., Ltd., Hitachi Chemical Co., Ltd., or the like). Note that as the adhesive 10, it is possible to use not only ultraviolet curing resin but also a photosetting adhesive which is cured with near-infrared light or near-ultraviolet light to which the cap 5 exhibits transparency.

Furthermore, the package body 4 which is located lateral to the semiconductor chip 2 may be a transparent section. In this case, it is possible to inspect not only abnormalities but also the shape in the height direction of the metal thin wire 9 that connects the semiconductor chip 2 and the electric wiring 7 of the package 1 and an inclination of the semiconductor chip 2 by observing the inside of the package 1 from sideways. Alternatively, the package body 4 below the semiconductor chip 2 may be a transparent section. In this case, it is possible to inspect whether or not any abnormality is interposed between the underside of the semiconductor chip 2 and the die bonding member 8 which fixes the semiconductor chip 2. That is, the transparent section may be disposed in such a way that an electronic part to be inspected can be observed from outside, and it is more preferable to configure an entire surface of at least any one of the top surface, undersurface and side face of the semiconductor device as the transparent section or configure the entire cap 5 as the transparent section.

Furthermore, the cap 5 may be manufactured by coating the base material surface made of transparent resin or glass with a visible light-absorbing material. Alternatively, a visible light non-transmissive filter may be acquired from the market (manufactured by HOYA Corporation, SIGMA KOKI Co., LTD. or the like) and applied to the cap 5.

As the material for the cap 5 transparent to a wavelength of near-infrared light, monocrystal silicon may be used which has a characteristic of being opaque at a wavelength of 1 μm or less and being transparent at a wavelength of 1.2 to 6 μm. In this case, the inside of the package 1 can be inspected using an infrared LED having a wavelength of 1300 to 1600 nm or the like as the light source for a foreign matter inspection.

Second Embodiment

Figure 3:
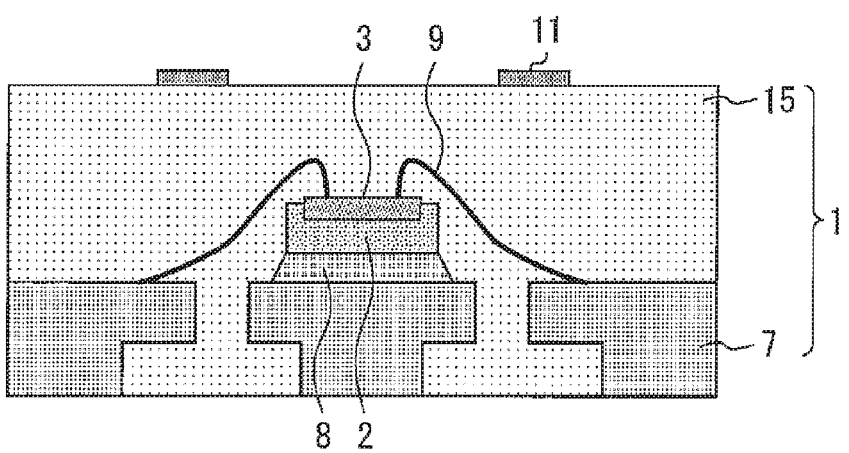
FIG. 3 is a cross-sectional view illustrating a semiconductor device according to a second embodiment of the present invention.

FIG. 3 is a cross-sectional view illustrating a semiconductor device according to a second embodiment of the present invention. The package 1 of the present embodiment is obtained by covering and fixing the semiconductor chip 2, the electric wiring 7 and the metal thin wire 9 through molding with sealing resin 15. The sealing resin 15 is obtained by mixing a visible light-absorbing material with transparent resin, and is a transparent section which is opaque to visible light and transparent to near-infrared light or near-ultraviolet light. Effects similar to those of the first embodiment can also be obtained using this configuration.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2015-163055, filed on Aug. 20, 2015 including specification, claims, drawings and summary, on which the Convention priority of the present application is based, is incorporated herein by reference in its entirety.

The invention claimed is:
1. A semiconductor device comprising:
a semiconductor chip including an electronic part; and
a package sealing the semiconductor chip,
wherein the package includes a transparent section which is opaque to visible light and transparent to near-infrared light or near-ultraviolet light, the transparent section is a cap layer including a base layer, a transparent conductive film, and a film of a visible light-absorbing material, and the transparent section is disposed in such a way that the electronic part is observed from outside under the near-infrared light or the near-ultraviolet light.

2. The semiconductor device of claim 1, wherein a mark is printed on the transparent section.

3. The semiconductor device of claim 1, wherein at least a part of the transparent section has conductivity.

4. The semiconductor device of claim 1, wherein the package includes a package body and a cap, the cap covers at least a part of a top surface of the package body, is the transparent section, and is fixed to the package body via a photosetting adhesive cured with the near-infrared light or the near-ultraviolet light.

5. The semiconductor device of claim 1, wherein the semiconductor device is any one of a microwave communication high-frequency signal amplification device, switching device, oscillator or monolithic microwave integrated circuit.

* * * * *